(12) United States Patent
Lee et al.

(10) Patent No.: US 9,515,143 B2
(45) Date of Patent: Dec. 6, 2016

(54) HETEROGENEOUS LAYERED STRUCTURE, METHOD OF PREPARING THE HETEROGENEOUS LAYERED STRUCTURE, AND ELECTRONIC DEVICE INCLUDING THE HETEROGENEOUS LAYERED STRUCTURE

(71) Applicant: Samsung Electronics Co., Ltd., Suwon-Si, Gyeonggi-Do (KR)

(72) Inventors: Sung-joo Lee, Seoul (KR); Young-jae Song, Seoul (KR); Min Wang, Seoul (KR); Sung-kyu Jang, Seoul (KR); Jae-young Choi, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/211,327

(22) Filed: Mar. 14, 2014

(65) Prior Publication Data
US 2014/0264282 A1 Sep. 18, 2014

(30) Foreign Application Priority Data
Mar. 18, 2013 (KR) ........................ 10-2013-0028757

(51) Int. Cl.
*H01L 29/12* (2006.01)
*H01L 29/16* (2006.01)
(Continued)

(52) U.S. Cl.
CPC ....... *H01L 29/1606* (2013.01); *H01L 21/0262* (2013.01); *H01L 21/02425* (2013.01);
(Continued)

(58) Field of Classification Search
CPC .................................................. H01L 29/1606
See application file for complete search history.

(56) References Cited

U.S. PATENT DOCUMENTS

| 8,980,217 B2 | 3/2015 | Hiura et al. |
| 2011/0303899 A1 | 12/2011 | Padhi et al. |

(Continued)

FOREIGN PATENT DOCUMENTS

| KR | 20080100430 A | 11/2008 |
| KR | 20090017454 A | 2/2009 |

(Continued)

OTHER PUBLICATIONS

Bischoff et al., 'Reactive ion etched graphene nanoribbons on a hexagonal boron nitride substrate,' 2012, J. Appl. Phys., vol. 101, pp. 203103.*

(Continued)

*Primary Examiner* — Bryan Junge
(74) *Attorney, Agent, or Firm* — Harness, Dickey & Pierce, P.L.C.

(57) ABSTRACT

A method of manufacturing a heterogeneous layered structure includes growing a hexagonal boron nitride sheet directly on a metal substrate in a chamber, increasing a temperature of the chamber to about 300° C. to about 1500° C., and forming a graphene sheet on the hexagonal boron nitride sheet by supplying a carbon source into the chamber while thermally treating the hexagonal boron nitride sheet at the increased temperature.

8 Claims, 15 Drawing Sheets

(51) Int. Cl.
H01L 21/02 (2006.01)
H01L 29/267 (2006.01)
H01L 29/778 (2006.01)

(52) U.S. Cl.
CPC .. *H01L 21/02458* (2013.01); *H01L 21/02527* (2013.01); *H01L 29/267* (2013.01); *H01L 29/778* (2013.01); *H01L 29/7781* (2013.01)

(56) References Cited

U.S. PATENT DOCUMENTS

| | | | |
|---|---|---|---|
| 2012/0282489 | A1 | 11/2012 | Shin et al. |
| 2014/0299839 | A1* | 10/2014 | Shepard .............. H01L 29/1606 257/29 |
| 2015/0079342 | A1* | 3/2015 | Boyd .................. C01B 31/0446 428/141 |

FOREIGN PATENT DOCUMENTS

| | | |
|---|---|---|
| KR | 2011-0052300 A | 5/2011 |
| KR | 20110068838 A | 6/2011 |
| KR | 20110071702 A | 6/2011 |
| KR | 20110138611 A | 12/2011 |
| KR | 20120007998 A | 1/2012 |
| KR | 20120009323 A | 2/2012 |
| KR | 10 1172625 B1 | 8/2012 |
| KR | 20120125149 A | 11/2012 |
| KR | 2013/0017521 A | 2/2013 |
| KR | 20130014182 A | 2/2013 |
| WO | WO-2009119641 A1 | 10/2009 |
| WO | WO-2012/086387 A1 | 6/2012 |
| WO | WO-2012/088334 A1 | 6/2012 |
| WO | WO-2013/022185 A1 | 2/2013 |

OTHER PUBLICATIONS

Kim et al., 'Chemical vapor deposition-assembled graphene field-effect transistor on hexagonal boron nitride,' 2011 Appl. Phys. Lett. vol. 98, pp. 262103-1-262103-3.*

Miyata et al., 'Fabrication and characterization of graphene/hexagonal boron nitride hybrid sheets,' 2012 Applied Physics Express, vol. 5, p. 085102.*

Ahn et al., 'Optical probing of electronic interaction between graphene and hexagonal boron nitride,' Jan. 2013, ACS NANO, vol. 7 No. 2, pp. 1533-1541.*

Lin et al., 'Hydrogen flame synthesis of few-layer graphene from a solid carbon source on hexagonal boron nitride,' 2012, J. Mater. Chem., vol. 22, pp. 2859-2862.*

Decker et al., Local Electronic Properties of Graphene on a BN Susbtrate Via Scanning Tunneling Microscopy, Nano Letters, 2011, 11, 2291-2295.

Shi et al., Sythesis of Few-Layer Hexagonal Boron Nitride Thin Film by Chemical Vapor Deposition, Nano Letters, 2010, 10, 4134-4139.

Dean et al., Boron Nitride Substrates for High-Quality Graphene Electronics, Nature Nanotechnology, vol. 5, 2010, 722-726.

Zhang et al., Origin of Spatial Charge Injomogeneity in Graphene, Nature Physics, vol. 5, 2009, 722-726.

Giovannetti et al., Substrate-Induced Band Gap in Graphene on Hexagonal Boron Nitride: AB Initio Density Functional Calculations, Physical Review B 76, 073103, 2007.

Yumeng Shi, et al. "Synthesis of Few-Layer Hexagonal Boron Nitride Thin Film by Chemical Vapor Deposition", Nano Letters, vol. 10. pp. 4134-4139 (2010).

Korean Office Action dated Apr. 3, 2015 issued in corresponding Korean Patent Application No. 10-2013-0028757 (English translation provided).

Korean Office Action dated Jul. 22, 2015 issued in corresponding Korean Patent Application No. 10-2013-0028757 (English Translation provided).

Yumeng Shi, et al. "Synthesis of Few-Layer Hexagonal Boron Nitride Thin Film by Chemical Vapor Deposition", Nano Letters, vol. 10, pp. 4134-4139, (2010).

Song, et al. "Large Scale Growth and Characterization of Atomic Hexagonal Boron Nitride Layers", Nano Letters, vol. 10, pp. 3209-3215 (2010).

Wang, et al. "A Platform for Large-Scale Graphene Electronics—CVD Growth of Single-Layer Graphene on CVD-Grown Hexagonal Boron Nitride", Advanced Materials, vol. 25, pp. 2746-2752 (2013).

Shi, et al. "Synthesis of Few-Layer Hexagonal Boron Nitride Thin Film by Chemical Vapor Deposition", Nano Letters, vol. 10, pp. 4134-4139 (2010).

Korean Office Action dated Nov. 17, 2015 issued in corresponding Korean Application No. 10-2013-0028757 (English translation provided).

Korean Office Action dated Jun. 23, 2016 issued in corresponding Korean Patent Application No. 10-2015-0153256 (English translation provided).

* cited by examiner

HETEROGENEOUS LAYERED STRUCTURE, METHOD OF PREPARING THE HETEROGENEOUS LAYERED STRUCTURE, AND ELECTRONIC DEVICE INCLUDING THE HETEROGENEOUS LAYERED STRUCTURE

CROSS-REFERENCE TO RELATED APPLICATIONS

This application claims the benefit of Korean Patent Application No. 10-2013-0028757, filed on Mar. 18, 2013, in the Korean Intellectual Property Office, the disclosure of which is incorporated herein by reference.

BACKGROUND

1. Field

Example embodiments of the present inventive concepts relate to a heterogeneous layered structure including a graphene sheet and a hexagonal boron nitride sheet, a method of preparing the heterogeneous layered structure, and an electronic device including the heterogeneous layered structure.

2. Description of the Related Art

Generally, graphite is an allotropic form of the element carbon having a structure in which two-dimensional (2D) graphene sheets of carbon atoms are stacked. The carbon atoms of the graphene sheets are connected to each other in an extended array of hexagonal rings. Due to relatively high transparency and high conductivity, graphene may be applicable to a variety of electronic devices, for example, in an electrode for displays or solar cells.

Most graphene devices may be manufactured by transferring graphene grown by chemical vapor deposition (CVD) or mechanically isolated graphene onto a dielectric material, e.g., $SiO_2$, $Al_2O_3$, or $HfO_2$. However, particles or impurities may remain between the graphene and the dielectric material during the transfer, causing interfacial defects, which consequently lower the electron mobility of the graphene and cause a hysteresis on the I-V characteristics of the graphene devices.

Hexagonal boron nitride (h-BN) as a material having a 2D structure consists of boron and nitrogen atoms in an hexagonal arrangement, has a similar lattice constant to graphene, a relatively large optical phonon energy, and a relatively large band gap of about 5.9 eV, and thus is drawing attention as a 2D material for high-performance graphene electronic devices. However, currently available methods of forming a layered structure of graphene/h-BN involve transferring CVD-grown graphene or mechanically exfoliating a graphene and an h-BN layer. This process has a limitation in the manufacture of a relatively large-area, high-quality layered structure necessary for mass production of electronic devices.

SUMMARY

Example embodiments provide a relatively large-size, high-quality heterogeneous layered structure of a hexagonal boron nitride sheet and a graphene sheet, the heterogeneous layered structure being relatively free of impurities and having improved interfacial characteristics.

Example embodiments also provide a method of manufacturing the heterogeneous layered structure. Example embodiments also provide an electronic device including the heterogeneous layered structure.

Additional aspects will be set forth in part in the description which follows and, in part, will be apparent from the description, or may be learned by practice of example embodiments.

According to example embodiments, a heterogeneous layered structure includes a hexagonal boron nitride sheet, and a graphene sheet on the hexagonal boron nitride sheet, wherein the heterogeneous layered structure leads to a Dirac point shift of about 0 V to about 10 V in a plot of resistance (R) versus gate voltage ($V_g$) in an electronic device.

According to example embodiments, a method of manufacturing a heterogeneous layered structure includes growing a hexagonal boron nitride sheet directly on a metal substrate in a chamber, increasing a temperature of the chamber to about 300° C. to about 1500° C., and forming a graphene sheet on the hexagonal boron nitride sheet by supplying a carbon source into the chamber while thermally treating the hexagonal boron nitride sheet at the increased temperature.

According to example embodiments, an electronic device includes the above-defined heterogeneous layered structure.

BRIEF DESCRIPTION OF THE DRAWINGS

These and/or other aspects will become apparent and more readily appreciated from the following description of the embodiments, taken in conjunction with the accompanying drawings in which.

Figure 14:
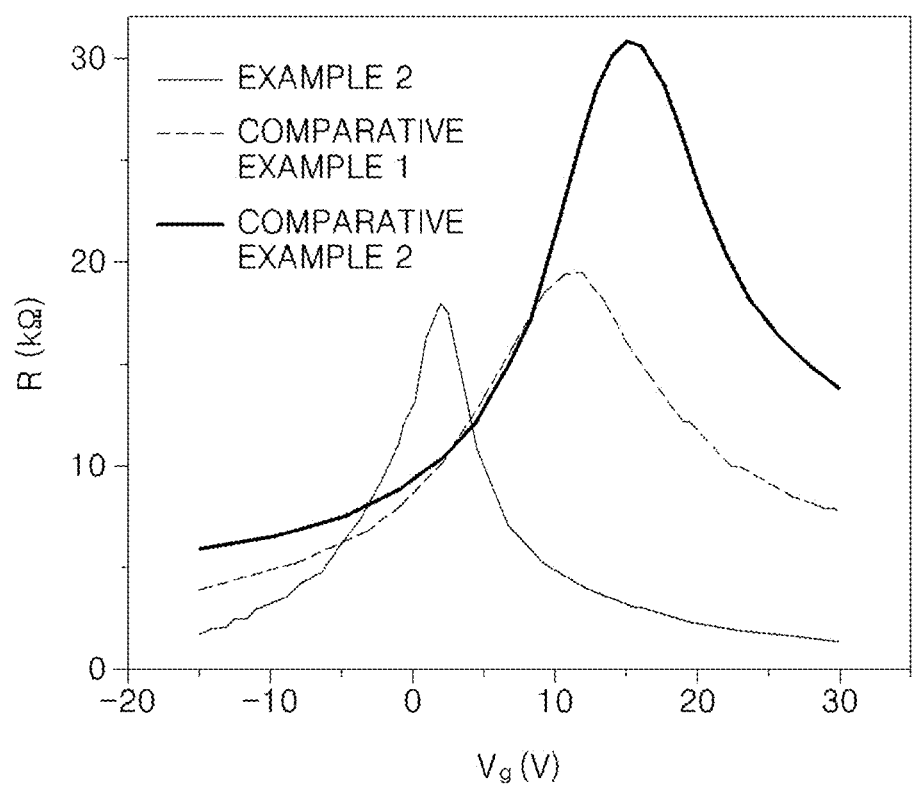
Figure 15:
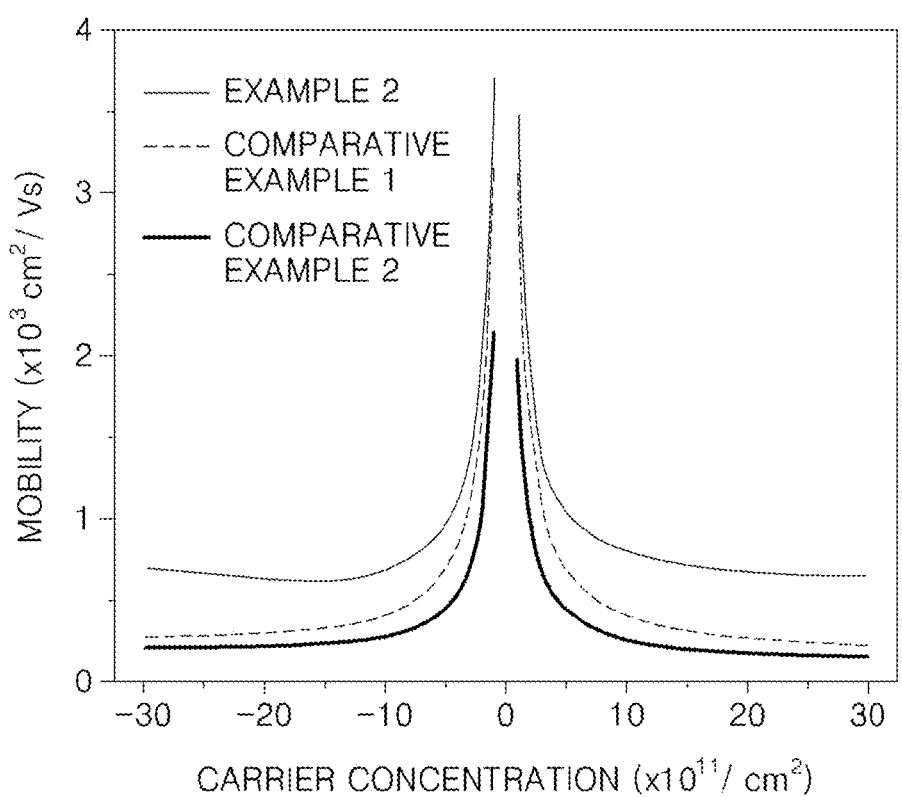

using the heterogeneous layered structure of the graphene sheet/h-BN sheet according to Example 1;

FIG. 14 is a graph of resistance (R) with respect to gate voltage (Vg) in FETs of Example 2 and Comparative Examples 1 and 2; and FIG. 15 is a graph of carrier mobility with respect to carrier density in the FETs of Example 2 and Comparative Examples 1 and 2.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments. As used herein, the term "and/or" includes any and all combinations of one or more of the associated listed items.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to example embodiments, a heterogeneous layered structure includes a hexagonal boron nitride (h-BN) sheet and a graphene sheet on the hexagonal boron nitride sheet, wherein, when used in an electronic device, the heterogeneous layered structure leads to a Dirac point shift of about 0 V to about 10 V in a plot of resistance (R) versus gate voltage (Vg).

In general, a shift in the Dirac point in a plot of resistance (R) versus gate voltage (Vg) may vary depending on the amount of interfacial impurities present between graphene and a dielectric material. The fewer the impurities at the interface between graphene and a dielectric material, the closer to zero a shift of the Dirac point is.

When the heterogeneous layered structure as a stack structure including a h-BN sheet and a graphene sheet is used in an electronic device, a shift in the Dirac point in a plot of resistance (R) versus gate voltage (Vg) may be as small as about 0 V to about 10 V, due to the presence of nearly no impurities in the layered structure of the h-BN sheet and the graphene sheet. In example embodiments, a shift of the Dirac point may be from 0 V to about 5 V, specifically from about 0 V to about 1 V.

In example embodiments, the h-BN sheet as a two-dimensional planar structure may include a $sp^2$ B—N covalent bond, and Van der Waals bonds between BN layers. The h-BN may have a relatively large area in a nano-thickness.

The h-BN sheet may have an atomic thickness as a single-layer thickness, or may have a multi-layer structure including at least two layers. The h-BN sheet may be a multi-layer structure having a thickness of, for example, about 10 nm or less, specifically about 5 nm or less, more specifically about 2 nm or less. When the thickness of the h-BN sheet is about 10 nm or less, the h-BN sheet may serve as a support on which graphene sheet may be directly grown thereon.

In example embodiments, the h-BN sheet may have at least one of a width and a length that is about 1 cm or greater, and/or have an area of about 1 $cm^2$ or larger. For example, the h-BN sheet may have an area from about 1 $mm^2$ to about 1 $m^2$. Such a large-area h-BN sheet may serve as a base for growing a large-area graphene sheet thereon for a large-area heterogeneous layered structure.

The graphene sheet is a layered structure of at least one polycyclic aromatic sheet including a plurality of carbon atoms linked to each other on a plane via a covalent bond (usually, via an $sp_2$ bond). The plurality of carbon atoms covalently linked to each other may form a six-membered ring as a standard repeating unit, or may further include 5-membered rings and/or 7-membered rings.

In example embodiments, the graphene sheet may include a single-layer graphene. The single-layer graphene may be advantageous in improving the performance of a graphene-based transistor due to the improvement of charge mobility and to control a field effect.

The heterogeneous layered structure may be manufactured using chemical vapor deposition (CVD). In example embodiments, the heterogeneous layered structure may be manufactured by continuously growing the graphene sheet by CVD on the large-area h-BN sheet grown directly on a metal substrate.

Such a heterogeneous layered structure manufactured as described above may suppress impurities from entering into the interface between the h-BN sheet and the graphene sheet during a separate transfer process, and thus may have a relatively high quality with fewer defects. Quality, thickness, and uniformity of the heterogeneous layered structure, specifically having a relatively large area, may be evaluated based on Raman spectra.

In example embodiments, a full width at half maximum (FWHM) of a 2D peak in the Raman spectrum of the heterogeneous layered structure may be from about 20 cm-1 to about 40 cm-1, mostly about 90% or more being from about 28 cm-1 to about 36 cm-1.

In example embodiments, an intensity ratio of D-band to G-band (ID/IG) in a Raman spectrum of the heterogeneous layered structure may be about 0.5 or less, for example, about 0.2 or less.

When the FWHM of the 2D peak and the intensity ratio of D-band to G-band (ID/IG) are within these ranges, the heterogeneous layered structure may have a relatively high quality with fewer defects.

An intensity ratio of G peak to 2D peak in the Raman spectrum of the heterogeneous layered structure may be from about 0.2 to about 0.9, mostly about 80% or more of the intensity ratios being from about 0.45 to about 0.65. When the intensity ratio of G peak to 2D peak is within these ranges, this means that the graphene sheet of the heterogeneous layered structure is a single-layered graphene.

In example embodiments, the heterogeneous layered structure may have a width and a length of which at least one is about 1 cm or greater, and/or have an area of about 1 cm2 or larger. For example, the heterogeneous layered structure may have an area from about 1 mm2 to about 1 m2. The heterogeneous layered structure may be manufactured by continuously growing a graphene sheet on a large-area h-BN sheet.

The heterogeneous layered structure including an h-BN sheet and a graphene sheet as described above may have improved interfacial characteristics and a relatively large area, and thus may be used in a variety of electronic devices, specifically in a graphene-based electronic device, to improve electrical performance. For example, when the heterogeneous layered structure is used as a graphene channel layer in a field effect transistor (FET), the FET may have significantly improved electron mobility characteristics.

According to example embodiments, a method of manufacturing any of the heterogeneous layered structures according to example embodiments may include providing an h-BN sheet grown directly on a metal substrate in a chamber, increasing a temperature of the chamber to a temperature ranging from about 300° C. to about 1500° C., and thermally treating the h-BN sheet at the increased temperature while supplying a carbon source into the chamber to form a graphene sheet on the h-BN sheet.

In particular, to manufacture a heterogeneous layered structure, first, an h-BN sheet grown directly on a metal substrate is prepared.

The metal substrate may serve as a catalyst for growing the h-BN sheet thereon, and a support for the grown h-BN sheet. The metal substrate may include at least one metal selected from the group consisting of copper (Cu), nickel (Ni), cobalt (Co), iron (Fe), platinum (Pt), palladium (Pd), gold (Au), aluminum (Al), chromium (Cr), magnesium (Mg), manganese (Mn), molybdenum (Mo), rhodium (Rh), silicon (Si), tantalum (Ta), titanium (Ti), tungsten (W), uranium (U), vanadium (V), zirconium (Zr), and an alloy thereof. The metal substrate may be in the form of a thinner or thicker sheet exclusively including a metal. The metal substrate may have a thickness of about 1 mm or less, and in example embodiments, a thickness of about 500 μm to about 10 μm.

A surface roughness of the h-BN sheet grown directly on the metal substrate may depend on the surface roughness of the metal substrate. When grown on a metal substrate with a rough surface, the h-BN sheet may have a rough surface and include more impurity particles, and consequentially, it may have degraded physical characteristics. Thus, to prevent or inhibit such deterioration in physical characteristics, the metal substrate may be treated to have a smooth surface before growing the h-BN thereon to render a surface of the h-BN sheet grown thereon to be smooth and include fewer impurity particles.

The h-BN sheet grown directly on the metal substrate may be manufactured as follows. For example, the h-BN sheet grown directly on the metal substrate may be manufactured by first thermally treating the metal substrate in the chamber to increase a grain size of the metal substrate; and second thermally treating the metal substrate while supplying a nitrogen source and a boron source, each in vapor phase, into the chamber to form the h-BN sheet on the metal substrate.

The first thermal treatment of the metal substrate before growing the h-BN sheet may increase the grain size of the metal substrate, ultimately improving the surface quality of the h-BN sheet.

The grain size of the metal substrate may be determined from an average of the areas of individual grains. For example, a mean area of the unit grains may be calculated by counting the number of grains within a selected area of an optical surface image of the metal substrate, for example, within a 1 cm×1 cm region of the optical surface image, and dividing the selected area of the optical surface image by the number of grains.

In example embodiments, the unit grains of the metal substrate after the first thermal treatment may have a mean area of about 1 μm 2 or greater, for example, a mean area of from about 1 μm 2 to about 1 cm2.

The first thermal treatment may be performed in a high-temperature chamber of, for example, about 500° C. to about 3,000° C., for about 10 minutes to about 24 hours. The larger the grain size of the metal substrate becomes through the first thermal treatment, the lower the resulting surface roughness of the metal substrate. In example embodiments, the metal substrate may have a surface roughness of about 7.0 nm or less, or of from about 0.01 to about 7.0 nm.

The interior atmosphere of the chamber may be maintained as an inert atmosphere and/or a reducing atmosphere during the first thermal treatment.

In example embodiments, the first thermal treatment may be repeated at least once, for example, several times, to obtain a larger grain size.

After increasing the grain size through the first thermal treatment as a surface control process for the metal substrate, the surface of the metal substrate may be further processed by polishing to provide a smoother surface. The polishing may include at least one selected from chemical polishing, physical (e.g., mechanical) polishing, chemical mechanical polishing, and electrolytic polishing.

The above-described polishing process may further smoothen the surface of the metal substrate with an increased grain size through the first thermal process, thus further improving the surface roughness of the metal substrate. The metal substrate in sheet form may have a smoother surface with a reduced surface roughness through the additional polishing process. The metal substrate may have a surface roughness of about 5.0 nm or less, and in example embodiments, from about 0.01 nm to about 5.0 nm.

The size and shape of the h-BN sheet grown on the metal substrate may be dependent upon the size and shape of the metal substrate. Accordingly, a large-area h-BN sheet may be obtained by controlling the size of the metal substrate. For example, with regard to the size of the metal substrate, at least one of the width and length may be about 1 cm or greater, and in example embodiments, may be about 1 m or 10 m or greater at a maximum. In some other embodiments, the metal substrate may have an area of about 1 cm2 or greater, for example, an area of about 1 cm2 to about 1 m2.

When the metal substrate is prepared in a selected pattern, the h-BN sheet grown on the surface of the metal substrate may also be in the same pattern as the metal substrate.

A high-quality, large-area h-BN sheet may be formed in a second thermal treatment while a nitrogen source and a boron source, which are both in vapor phase, are supplied into a chamber to contact the metal substrate which has been first thermally treated and/or polished as described above.

The nitrogen source is not specifically limited, and may be any of a variety of nitrogen sources able to supply nitrogen in vapor phase. In example embodiments, the nitrogen source may include at least one selected from $NH_3$ and $N_2$.

The boron source is not specifically limited, and may be any of a variety of boron sources able to supply boron in vapor phase. In example embodiments, the nitrogen source may be at least one selected from $BH_3$, $BF_3$, $BCl_3$, $B_2H_6$, $(CH_3CH_2)_3B$, $(CH_3)_3B$, and diborane.

In example embodiments, a supply source for both nitrogen and boron may be at least one selected from borazan $(H_3NBH_3)$, and borazine $((BH)_3(NH)_3)$.

The nitrogen supply source and boron supply source may be supplied in vapor phase into the chamber. The nitrogen supply source and boron supply source may not be in vapor form. In example embodiments, solid nitrogen- and boron-containing materials may be vaporized in an external vessel, and then be used.

In particular, after heating a solid nitrogen- and boron-containing compound placed in an external vessel to a predetermined or given temperature to be vaporized (i.e., sublimation), the gaseous nitrogen-containing and boron-containing compound in vapor form may be supplied into the chamber containing catalyst metal.

The vapor phase nitrogen and boron supply source obtained through vaporization in the external source may be supplied into the chamber together with nitrogen gas.

In this regard, a temperature of the external vessel and a flow rate of the nitrogen gas may be appropriately adjusted to control the amounts of nitrogen and boron supplied into the chamber, thus ultimately to control growth of h-BN.

For example, the solid nitrogen- and boron-containing compound placed in the external vessel may be an ammonia-borane ($NH_3$—$BH_3$) compound. The ammonia-borane compound vaporizes at about 130° C., based on which the temperature of the external vessel may be appropriately adjusted to control the amounts of vaporized $NH_3$ and $BH_3$.

The vapor-phase nitrogen source and boron source may be supplied in a selected flow rate into a reactor, for example, in a 1:1 stoichiometric ratio, for example, at a flow rate of from about 1 sccm to about 100 sccm.

The nitrogen source and the boron source may be supplied in an inert atmosphere and/or a reducing atmosphere. The inert atmosphere may be created using an inert gas, for example, nitrogen gas, argon gas, or helium gas. The reducing atmosphere may be created using hydrogen gas. An inert gas and hydrogen gas may be supplied as mixed gases. The inert gas may be supplied into the reactor at a flow rate of about 100 sccm to about 1000 sccm, specifically from about 300 sccm to about 700 sccm. The hydrogen gas may be supplied into the reactor at a flow rate of about 100 sccm to about 1000 sccm, specifically from about 300 sccm to about 700 sccm.

The second thermal treatment as a process for growing an h-BN sheet on the surface of the metal substrate may be performed at an appropriate temperature for a selected time. For example, the second thermal treatment may be performed at a temperature of from about 700° C. to about 1,200° C., and in example embodiments, at a temperature of from about 700° C. to a melting point of the metal substrate, for about 1 minute to about 2 hours. A selected cooling process may be performed on a resulting product from the second thermal treatment. This cooling process uniformly grows and arranges h-BN on the catalyst metal. The cooling process may be performed, for example, at a rate of about 10° C. to about 100° C. per minute. In the cooling process, nitrogen gas as an inert gas may be supplied at a constant flow rate. The cooling process may be a natural cooling process, which may be implemented by stopping operation of a heat source or by removing the heat source from the reactor.

The h-BN sheet resulting from the cooling process may have an atomic thickness as a single-layer thickness, or may have a multi-layer structure including at least two layers. The h-BN sheet may have a multi-layer structure, for example, having a thickness of about 10 nm or less, specifically, about 5 nm or less, more specifically, about 2 nm or less. When the thickness of the h-BN sheet is within these ranges, characteristics of a graphene-based transistor including the h-BN sheet may be improved, or may be maintained at least, without a significant dielectric constant reduction in a gate insulating layer.

After the h-BN sheet grown directly on the metal substrate as described above is loaded into the chamber, the chamber temperature may be increased to about 300° C. to about 1500° C. When the chamber temperature is within this range, an appropriate atmosphere for growing the graphene sheet, damaging neither the metal substrate nor the h-BN sheet, may be created within the chamber.

Heat sources for increasing the chamber temperature and a subsequent thermal treatment are not specifically limited, and may be induction heat, radiant heat, laser, infrared (IR) heat, microwaves, plasma, ultraviolet (UV) rays, or surface plasmon heat.

Such a heat source may be equipped into the chamber to increase the temperature in the chamber to a selected temperature and maintain the temperature thereof constant.

While the temperature of the chamber is maintained within the range, a carbon source is supplied in vapor phase into the chamber to grow a graphene sheet on the h-BN sheet.

The vapor-phase carbon source may be any of a variety of materials able to supply carbon and be present in vapor phase at a temperature of 300° C. or higher. The vapor-phase carbon source may be any carbon-containing compound. For example, the vapor-phase carbon source may be a compound including six or less carbon atoms, a compound including four or less carbon atoms, or a compound including two or less carbon atoms. For example, the vapor-phase carbon source may include at least one selected from the group consisting of carbon monoxide, methane, ethane, ethylene, ethanol, acetylene, propane, propylene, butane, butadiene, pentane, pentene, cyclopentadiene, hexane, cyclohexane, benzene, and toluene.

The carbon source may be supplied at a constant flow rate into the chamber in which the metal substrate with the h-BN sheet grown thereon is placed, for example, at a flow rate of about 1 sccm to about 100 sccm.

The carbon source may be supplied in a chamber in an inert gas or reducing gas atmosphere. The inert atmosphere may be created using an inert gas, for example, nitrogen gas, argon gas, or helium gas. The reducing atmosphere may be created using hydrogen gas. The surface of the metal substrate may be maintained clean using hydrogen to control a vapor phase reaction in the chamber.

The inert gas and the hydrogen gas may be supplied as a mixed gas. The inert gas may be supplied into the reaction chamber, for example, at a flow rate of about 100 sccm to about 1000 sccm, specifically about 300 sccm to about 700 sccm. The hydrogen gas may be supplied into the reaction chamber, for example, at a flow rate of about 100 sccm to about 1000 sccm, specifically about 300 sccm to about 700 sccm.

The thermal treating of the h-BN sheet may be performed while maintaining the temperature of the chamber increased to about 300° C. to about 1500° C., and in example embodiments, may be performed at a temperature of about 500° C. to about 1000° C. The thermal treating may be performed at a higher temperature for a metal substrate in thick sheet form than for a metal substrate in thin sheet form.

The thermal treating may be performed for a selected time, so that the degree of generation of the graphene sheet may be controlled. In other words, the duration of the thermal treating may be controllable to obtain a desired graphene sheet, for example, a single-layered graphene sheet. The thermal treating may be performed for, for example, about 10 minutes to about 100 hours. When the duration of the thermal treating is shorter than this range, a graphene sheet may not be sufficiently grown. When the duration of the thermal treating is longer than this range, the graphene sheet may be too thick and undergo graphitization.

The resulting product from the thermal treating may be subjected to a selected cooling process. The cooling process may help graphene grow uniformly in orientation in sheet form. A rapid cooling may cause cracks in the graphene sheet. The cooling may be performed slowly at a constant rate, for example, at a rate of about 0.1° C. to about 10° C. per minute. For example, the resulting product from the thermal treating may be naturally cooled. The natural cooling may be performed by simply removing the heat source used for the thermal treatment. A sufficient cooling rate may be reached merely by removing the heat source. The thermal treatment and the cooling process may be performed for one cycle. However, the thermal treatment and the cooling process may be repeated several times to generate a high-density graphene sheet.

The graphene sheet resulting from the thermal treatment may be a single layer.

A large-area graphene sheet may be obtained by freely varying the sizes of the metal substrate and the h-BN sheet. For example, the graphene sheet may have at least one of a width and a length that is about 1 cm or greater, and in example embodiments, about 1 m or 10 m or greater at a maximum. In some other embodiments, the graphene sheet may have an area of about 1 cm2 or greater.

As described above, the heterogeneous layered structure obtained by continuously growing a graphene sheet by CVD on an h-BN sheet grown directly on a metal substrate may have a relatively high interfacial quality since it may prevent or inhibit adsorption of water molecules or impurities to the interface between the h-BN sheet and the graphene sheet, compared to a structure with a graphene sheet transferred to an h-BN sheet via a mechanical exfoliation and transfer process.

According to example embodiments, an electronic device includes the heterogeneous layered structure according to any of the above-described embodiments.

In example embodiments, the heterogeneous layered structure including an h-BN sheet and a graphene sheet may be used in a variety of electronic devices, for example, in a sensor, a bipolar junction transistor, a FET, a heterojunction bipolar transistor, a single-electron transistor, a light-emitting diode, or an organic light-emitting diode. The graphene sheet of the heterogeneous layered structure may be may be used as a channel layer of these devices, and the h-BN sheet may be used as, for example, a buffer layer between an electrode and the channel layer.

Figure 1:
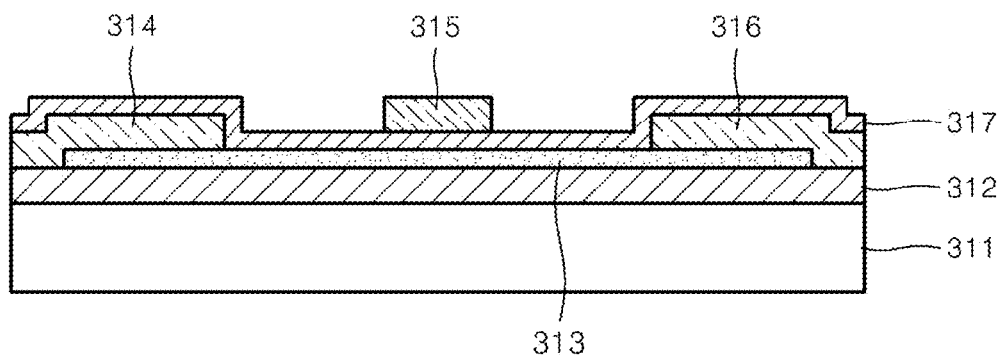
FIG. 1 is a schematic view of a field effect transistor (FET) according to example embodiments.

FIG. 1 is a schematic cross-sectional view of a FET according to example embodiments. Referring to FIG. 1, a silica substrate 312 is disposed on a substrate 311, and a heterogeneous layered structure 313 is disposed as a channel layer on the silica substrate 312. A source electrode 314 and a drain electrode 316 are on the left and right sides, respectively, with a gate electrode 315 on an insulating layer 317 between the source electrode 314 and the drain electrode 316. A current flow across the source electrode 314 and the drain electrode 316 may be controlled by applying a voltage to the gate electrode 315. That is, the heterogeneous layered structure 313 may form a channel region, and a current flow between the source electrode 314 and the drain electrode 316 may be controlled by the voltage applied to the gate electrode 315 to turn the FET on or off.

Figure 2:
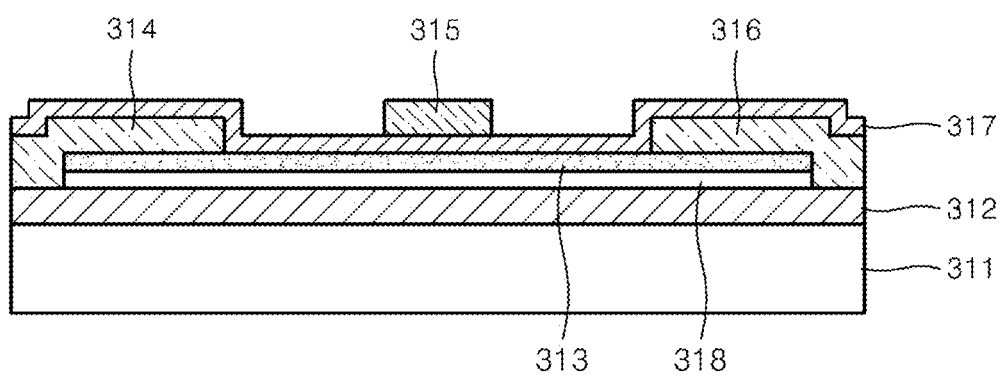
FIG. 2 is a schematic view of a FET according to example embodiments.

FIG. 2 is a schematic cross-sectional view of a FET according to example embodiments. In the example embodiment illustrated in FIG. 2, to control scattering of charges migrating from the heterogeneous layered structure 313, i.e., a channel layer, caused by a surface roughness of the silica substrate 312 and a dangling bond, a buffer layer 318 may be disposed between the heterogeneous layered structure 313 and the silica substrate 312. For example, the buffer layer 318 may be a heterogeneous layered structure including a graphene sheet on an h-BN sheet. In the heterogeneous layered structure as the buffer layer 318, the h-BN sheet underlying the graphene sheet is in contact with the silica substrate 312.

In example embodiments, to improve injection efficiency, a buffer layer (not shown) may be disposed between the heterogeneous layered structure 313 and the insulating layer 317. The buffer layer for this purpose may be an h-BN sheet or a heterogeneous layered structure as described above.

Example embodiments will now be described in more detail with reference to the following examples. However, these examples are for illustrative purposes only and are not intended to limit the scope of the one or more example embodiments.

EXAMPLE 1

Figure 3:
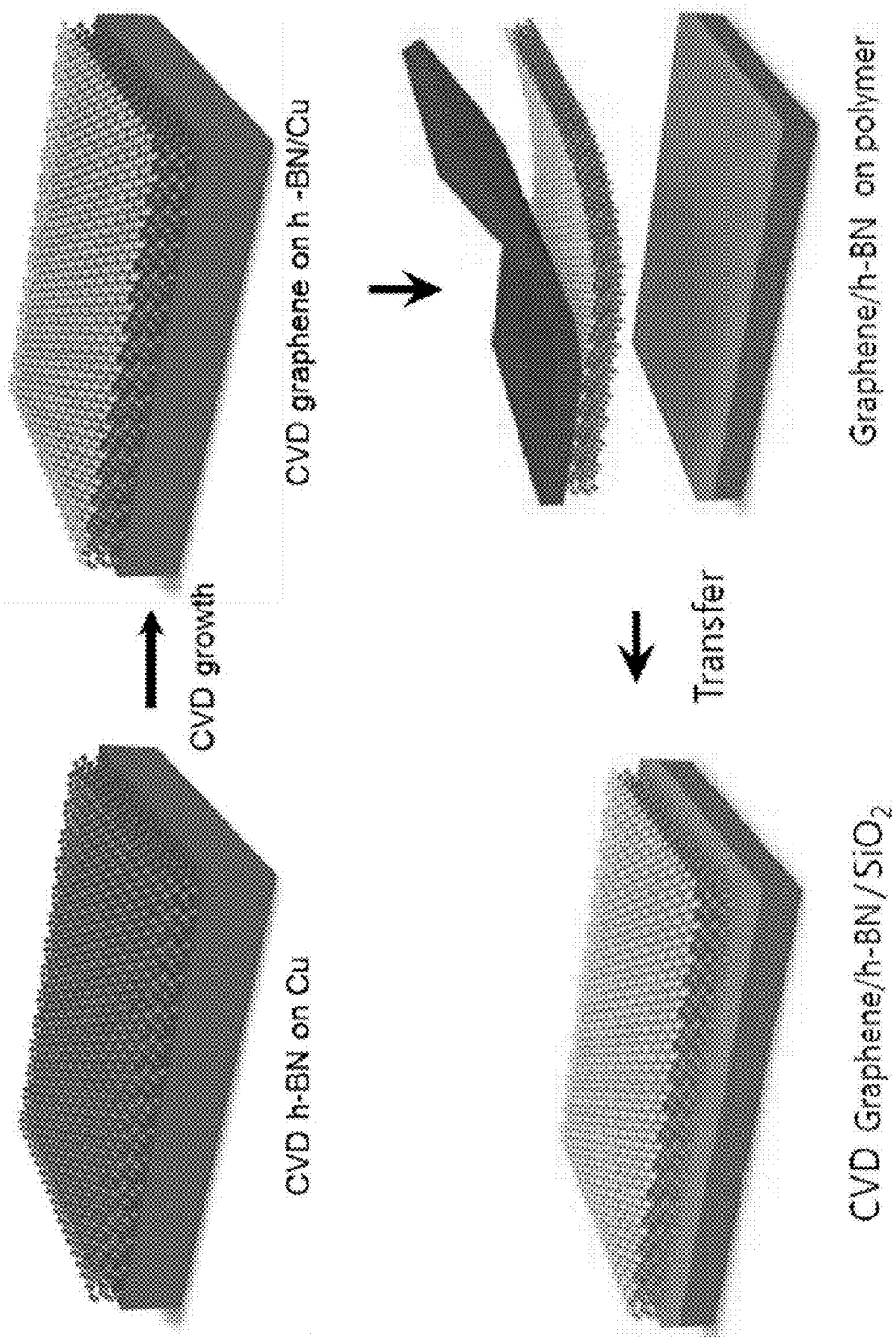
FIG. 3 is a schematic view illustrating a method of manufacturing a heterogeneous layered structure including a graphene sheet/h-BN sheet, according to Example 1.

As illustrated in FIG. 3, a copper foil with an h-BN sheet grown by CVD thereon was used to continuously grow a graphene sheet directly on the h-BN sheet of the copper foil by CVD. Consequently, the graphene sheet was transferred onto a $SiO_2$ substrate by using polymethylmethacrylate (PMMA). These processes will now be described in greater detail below.

Preparation of an h-BN Sheet Grown Directly on a Copper Foil

A copper foil (available from Alpha Acer) having a size of 2 cm×10 cm and a thickness of 125 μm was washed with a diluted nitric acid and deionized water, and then loaded into a CVD chamber, which was then heated gradually using an inductive heating source to a temperature of about 1000° C. for about 2.5 hours while being supplied with a mixed gas of $Ar/H_2$ (15% by volume of $H_2$, 85% by volume of Ar) at about 1000 sccm.

Subsequently, ammonia borane ($NH_3$—$BH_3$) as a source material was heated in a sub-heating chamber to about 110-130° C. to sublimate along with a nitrogen gas supplied at 25 sccm, and supplied into the CVD chamber to grow h-BN for about 30 minutes. During the growth of h-BN, the CVD chamber was supplied with the $Ar/H_2$ mixed gas at about 75 sccm at about 1,000° C.

After the growing of h-BN was complete, the heating source was removed from the CVD chamber, which was then cooled down to about 180° C. while being supplied with the Ar/H$_2$ mixed gas at about 100 sccm for about 4 hours.

Formation of Graphene Sheet

After being evacuated to a vacuum level, the CVD chamber, including the copper foil with the h-BN sheet grown thereon, was heated using an inductive heating source gradually to about 1000° C. for about 60 minutes, followed by annealing for about 30 minutes to synthesize a graphene sheet while supplying H$_2$ gas into the CVD chamber at a pressure of 40 mTorr and at a flow rate of 5 sccm.

The reaction product was further heated at about 1000° C. for about 40 minutes while supplying CH$_4$ gas at about 205 sccm into the CVD chamber at a chamber pressure of 40 mTorr.

The supplying of CH$_4$ gas was stopped, followed by removing the heating source from the CVD chamber, which was then naturally cooled down to room temperature to complete the synthesis of the graphene sheet.

Separation Process

PMMA was coated on the graphene sheet grown on the h-BN sheet of the copper foil, which was then dipped in an aluminum persulfate aqueous solution (40 g/L) overnight to etch away the copper foil. Afterward, the structure of h-BN sheet/graphene sheet/PMMA was washed several times with deionized water.

Transfer Process

The structure of h-BN sheet/graphene sheet/PMMA was placed on a SiO$_2$/Si substrate to contact the h-BN sheet to a surface of a SiO$_2$ region of the substrate, followed by drying in the air for 1 hour and then heating at about 90° C. for about 5 minutes. The resultant was then dipped in cold acetone for about 30 minutes to dissolve the PMMA from the layered structure.

A layered structure of graphene sheet/h-BN sheet/SiO$_2$/Si substrate was obtained through these transfer processes.

Experimental Example 1 h-BN Sheet Structure Analysis

Crystalline structures and electrical characteristics of the graphene sheet/h-BN sheet grown continuously on the copper foil by CVD in Example 1 were analyzed using scanning tunneling microscopy (STM) and scanning tunneling spectroscopy (STS) before being transferred onto the SiO$_2$/Si substrate. The STM/STS was performed using a Pt/Ir tip at a temperature of about 80K and a pressure of about 5.0× 10-11 Torr.

Figure 4:
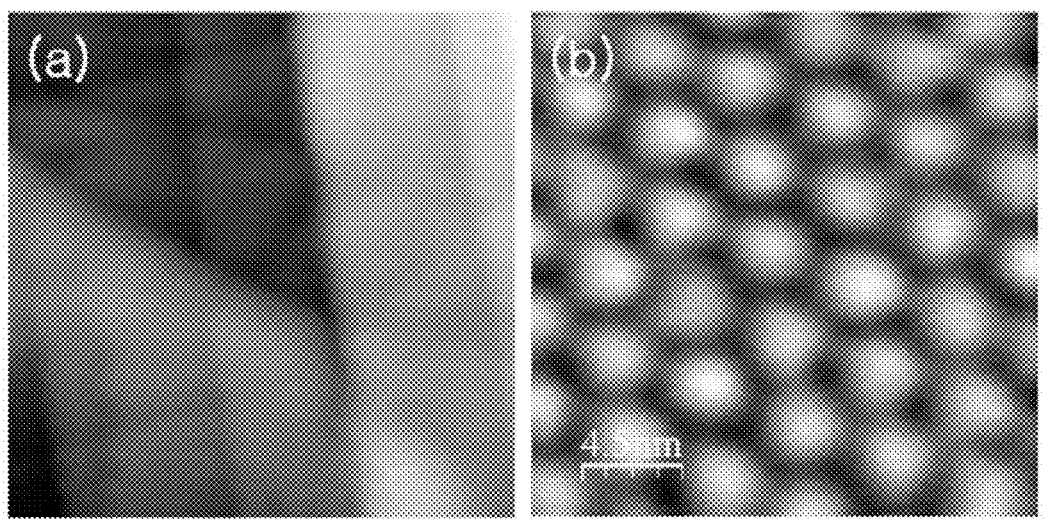
FIG. 4 is a scanning tunneling microscopic (STM) image of the graphene sheet/h-BN sheet and, which are sequentially CVD-grown on a copper foil in Example 1.

An STM image of the graphene sheet/h-BN sheet grown continuously by CVD is shown in FIG. 4. The STM was performed at Vb of 1.0 V and It of 0.1 nA.

FIG. 4 (a) is an STM image of a 60 nm×60 nm region, illustrating the h-BN sheet underlying the graphene sheet.

Referring to FIG. 4 (b), which is a magnification of a region of the image (a), the h-BN sheet is found to have a honey comb-like crystal structure in a hexagonal Moiré pattern with an interference period, mostly, of 0.55 nm, due to having a similar atomic structure as graphene.

Figure 5:
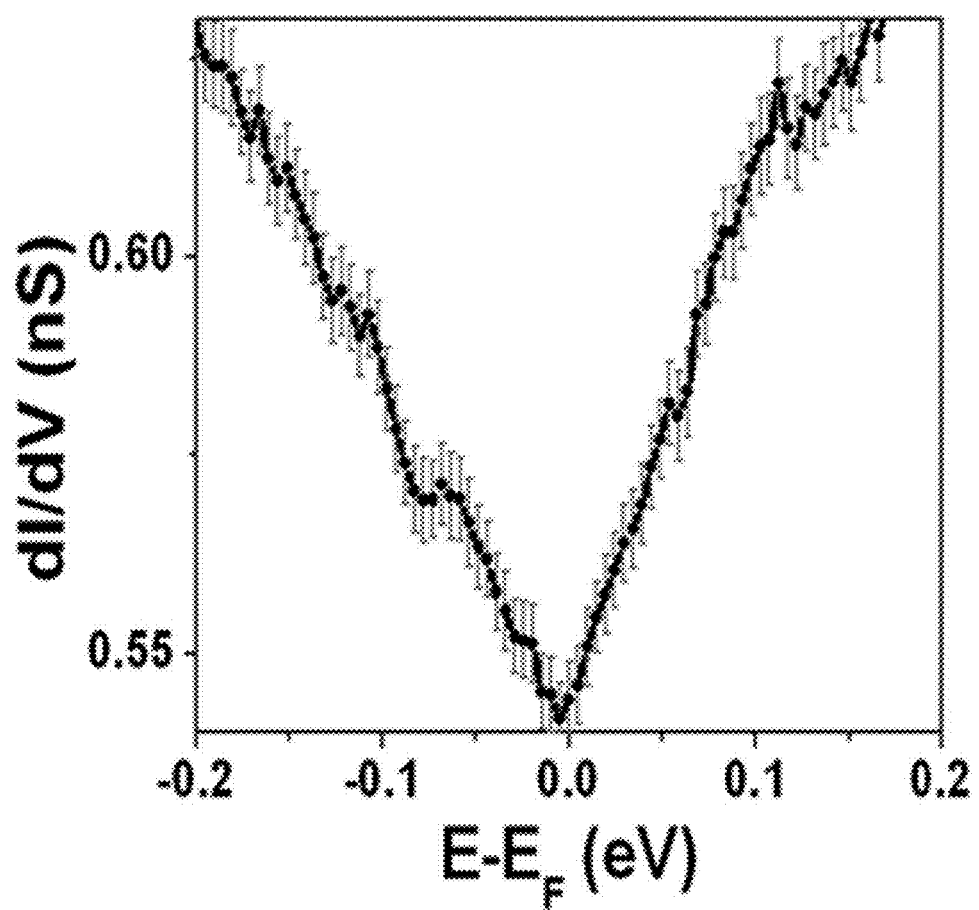
FIG. 5 is a averaged dI/dV spectra of the graphene sheet/h-BN sheet, which are sequentially CVD-grown on the copper foil in Example 1, obtained by scanning tunneling spectroscopy (STS)

Averaged dI/dV data from the STS on the Moiré pattern in a period of 0.55 nm at Vb of 0.2 V and It of 0.2 nA is shown in FIG. 5.

Referring to FIG. 5, the overall spectrum is found to be in a sharp, symmetrical V-shape with a Dirac point at the Fermi level. This pattern is considered to be most similar to the original shape for a graphene itself known so far.

Experimental Example 2

TEM Analysis

Figure 6:
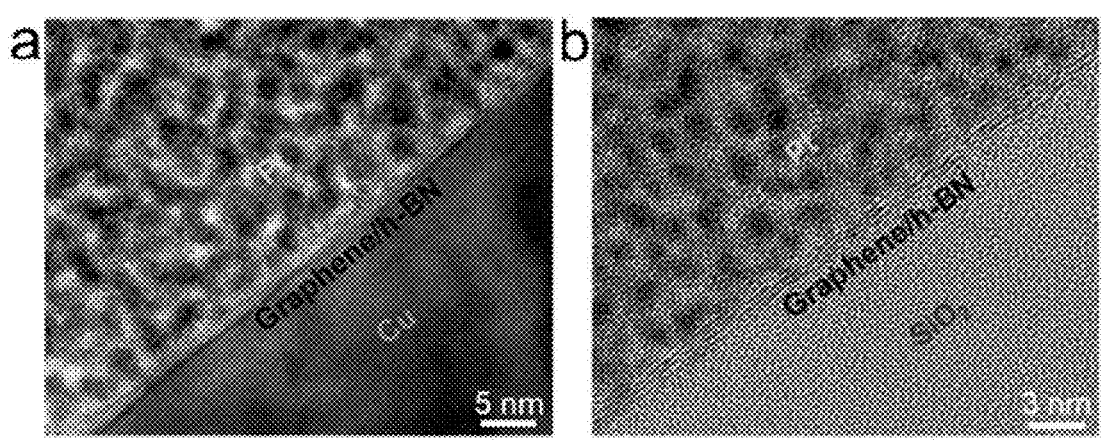
FIG. 6 illustrates transmission electron microscopic (TEM) images of a cross-section of the graphene sheet/h-BN sheet, which are sequentially CVD-grown on the copper foil in Example 1, before and after transferring onto a $SiO_2$/Si substrate, respectively.

Transmission electron microscopic (TEM) images of the graphene sheet/h-BN sheet grown by CVD before and after being transferred onto the SiO$_2$/Si substrate in Example 1 are shown in FIGS. 6 (a) and (b), respectively. Pt in FIG. 6 was grown for TEM analysis.

Referring to FIG. 6, the heterogeneous layered structure of graphene sheet/h-BN sheet prepared in Example 1 was found to have a thickness of about 2 nm, and remain even after being transferred onto the SiO$_2$/Si substrate.

As a result of analyzing the results from the cross-sectional TEM analysis before and after the transfer process together with the results from atomic resolution TEM, the graphene sheet/h-BN sheet grown by CVD was highly apt to crystallization and was durable throughout the transfer process.

Experimental Example 3

EESL Analysis

Figure 7A:
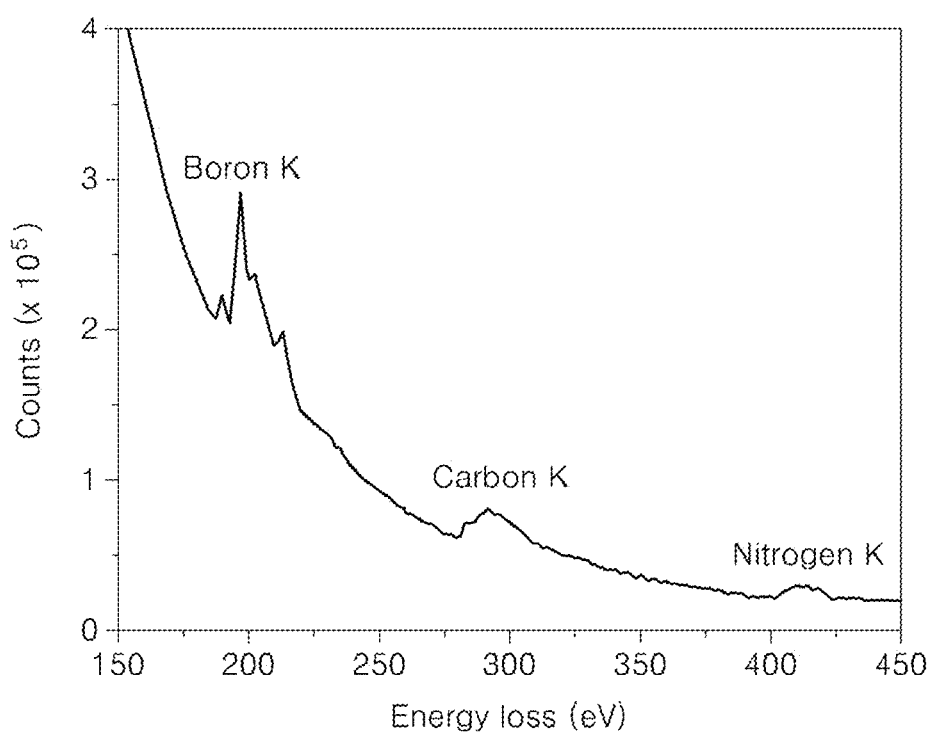
FIG. 7A is a graph illustrating the results of electron energy loss spectroscopy (EESL) based on the TEM image of the graphene sheet/h-BN sheet grown by chemical vapor deposition (CVD) in Example 1.
Figure 7B:
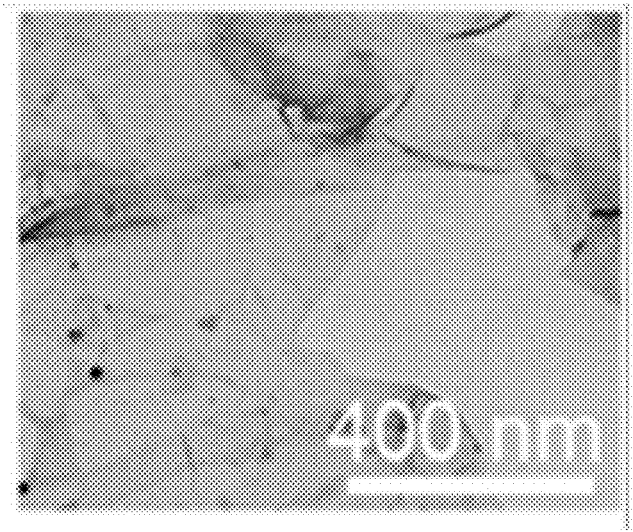
FIG. 7B is a TEM image of the graphene sheet/h-BN sheet grown by CVD in Example 1, which was used for EESL.

The TEM image of the graphene sheet/h-BN sheet grown by CVD in Example 1, i.e. FIG. 7B, was analyzed by electron energy loss spectroscopy (EESL). The results are shown in FIG. 7A.

Referring to FIG. 7A, three edges near 200 eV, 290 eV, and 410 eV correspond to feature K-shell ionization edges of boron (B), carbon (C), and nitrogen (N), respectively, indicating the presence of B, C, and N in the heterogeneous layered structure of graphene sheet/h-BN sheet grown by CVD.

Experimental Example 4

UV-Vis Absorption Curve Analysis

Figure 8:
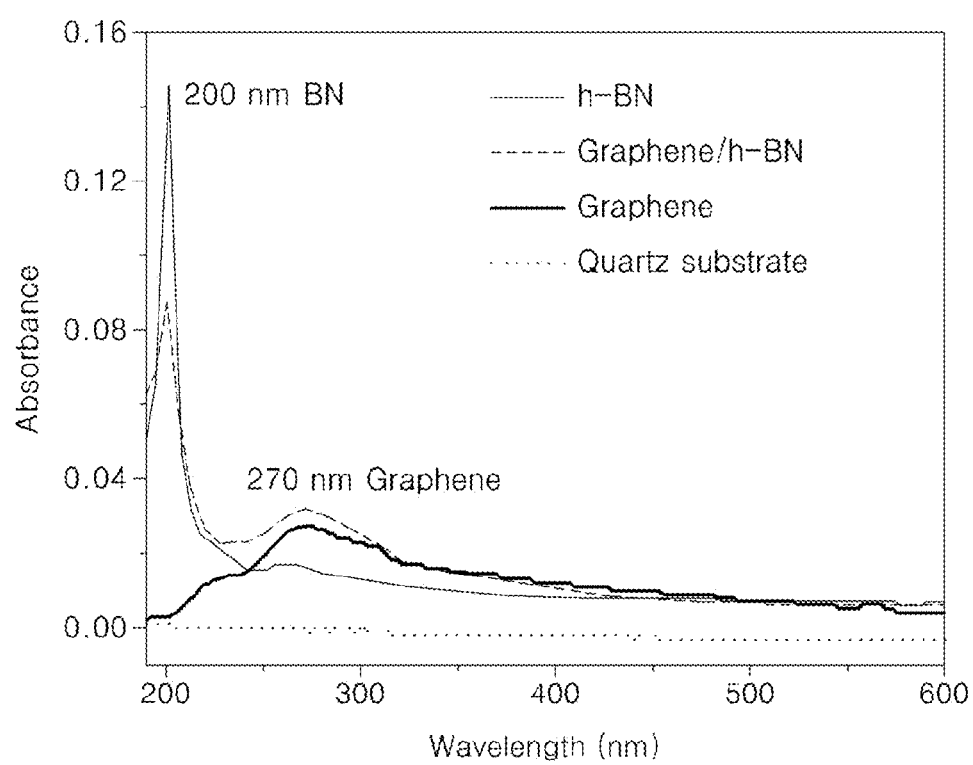
FIG. 8 is a UV-Vis absorption curve of the graphene sheet/h-BN sheet grown by CVD in Example 1.

A UV-Vis absorption curve of the graphene sheet/h-BN sheet grown by CVD in Example 1 is represented in FIG. 8, along with UV-Vis absorption curves of an h-BN sheet and a graphene sheet individually grown by CVD.

Referring to FIG. 8, the graphene sheet/h-BN sheet grown by CVD in Example 1 was found to exhibit two absorption peaks at 200 nm and 270 nm, which correspond to peaks observed with the CVD-grown h-BN sheet and the CVD-grown graphene sheet, respectively, indicating the presence of both graphene and h-BN in the heterogeneous layered structure of Example 1.

Experimental Example 5

Raman Spectrum Analysis

Figure 9:
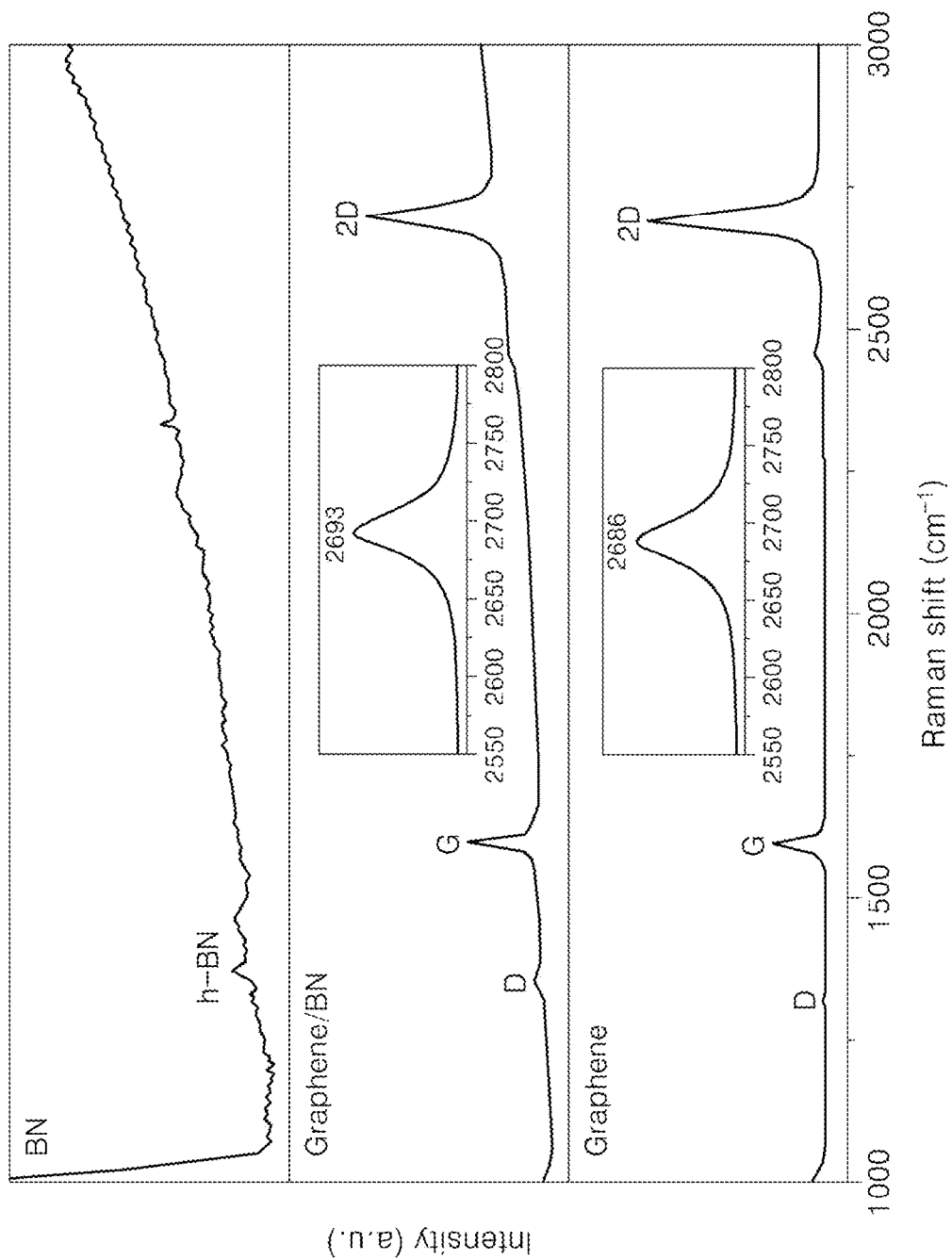
FIG. 9 illustrates Raman spectra of the graphene sheet/h-BN sheet grown by CVD in Example 1.

Raman spectra of the graphene sheet/h-BN sheet grown by CVD in Example 1 were measured and represented in FIG. 9, along with those of a CVD-grown h-BN sheet and a CVD-grown graphene sheet.

Referring to FIG. 9, the h-BN sheet having no graphene sheet thereon exhibits a peak at 1,368 cm-1 due to the E2g vibration mode of h-B, while the h-BN sheet with a graphene sheet grown thereon by CVD in Example 1 exhibits G and 2D bands of graphene at 1593 cm-1 and 2693 cm-1, respectively.

In FIG. 9, the Raman spectrum of the graphene sheet/h-BN sheet grown by CVD in Example 1 exhibits a narrow and symmetric Lorentzian 2D peak (refer to the inset spectrum in the middle graph of FIG. 9) with an FWHM of about 34 cm-1 and an IG/I2D peak intensity ratio less than 0.5 (IG/I2D<0.5), which correspond to those levels of single-layered graphene, indicating that the graphene sheet of Example 1 grown on the h-BN sheet by CVD has a single layer.

Figure 10:
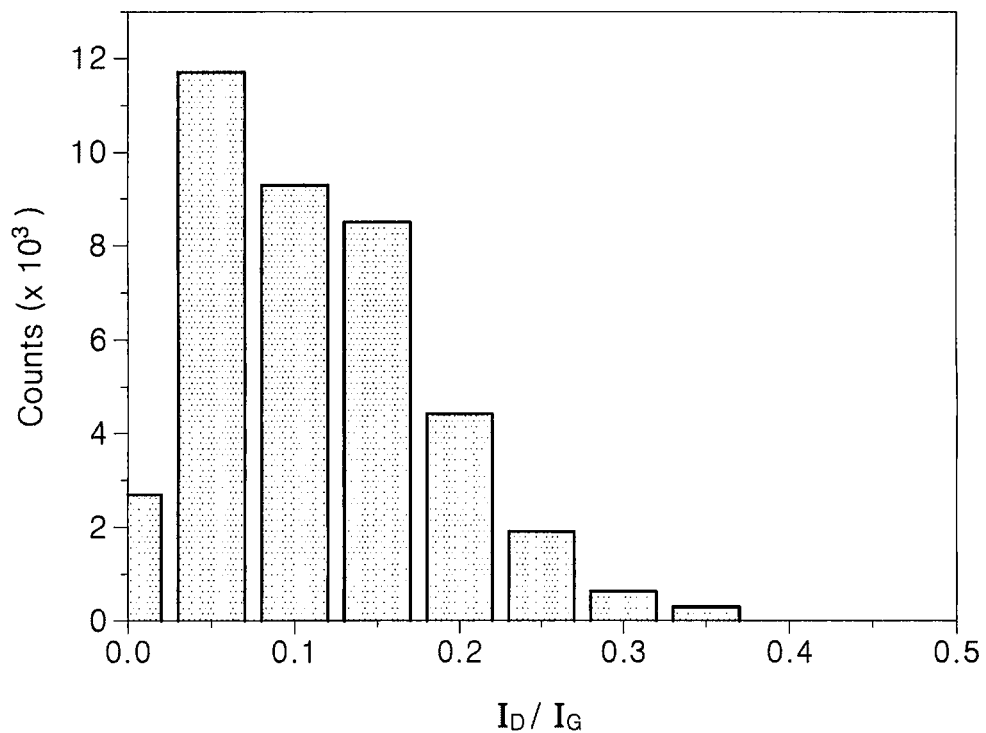
FIG. 10 is a graph of ID/IG peak intensity ratio distribution obtained from the Raman spectra of FIG. 9.

FIG. 10 is a statistical histogram of ID/IG peak intensity ratios obtained from Raman mapping of the graphene sheet grown on the h-BN sheet by CVD in Example 1. Referring to FIG. 10, about 93% of the graphene sheet grown on the h-BN sheet has an ID/IG peak intensity ratio less than 0.2 (ID/IG<0.2), which is far smaller than typical levels of several graphene sheets grown on h-BN powder or h-BN/Al2O3 and is equivalent to that of graphene grown on Cu or Ni, indicating that the graphene sheet of Example 1 has a relatively high quality without defects.

Figure 11:
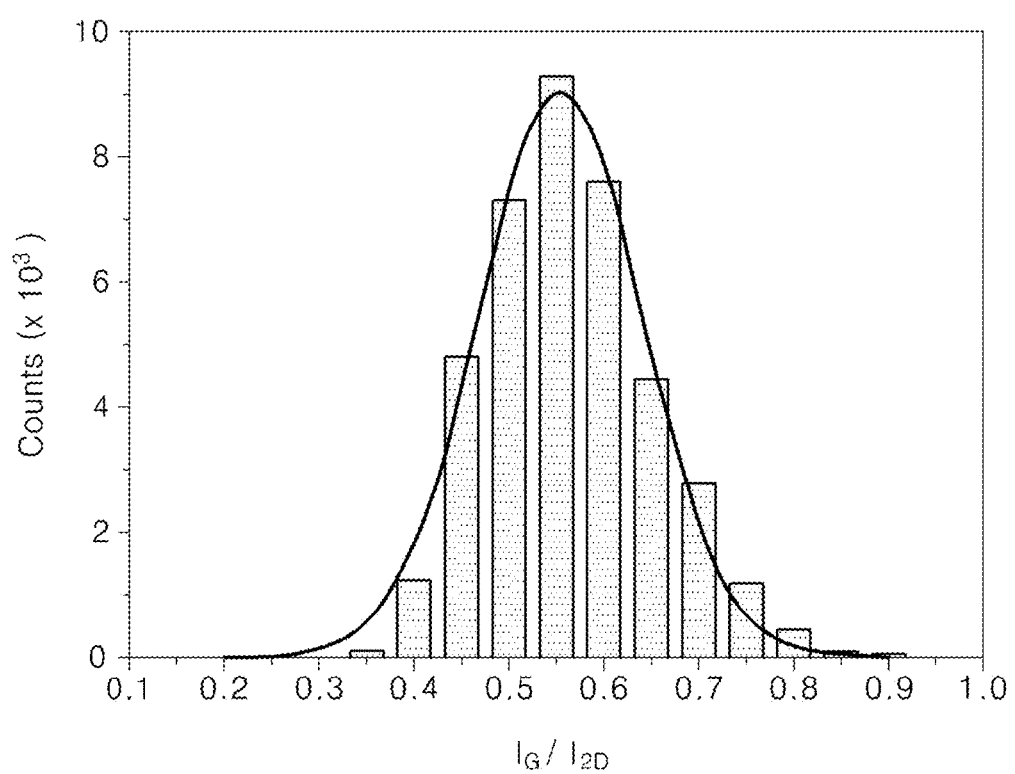
FIG. 11 is a graph of IG/I2D peak intensity ratio distribution obtained from the Raman spectra of FIG. 9.

FIG. 11 is a graph illustrating the distribution of IG/I2D peak intensity ratios obtained from the Raman spectrum in FIG. 9 of the graphene sheet grown on the h-BN sheet by CVD in Example 1. Referring to FIG. 11, the graphene sheet of Example 1 has an IG/I2D peak intensity ratio ranging from about 0.2 to about 0.9, mostly about 84% ranging from about 0.45 to about 0.65, which is far smaller than a typical level of double-layered graphene that is less than about 1 (~1), indicating that the graphene sheet of Example 1 grown by CVD has a single layer.

Figure 12:
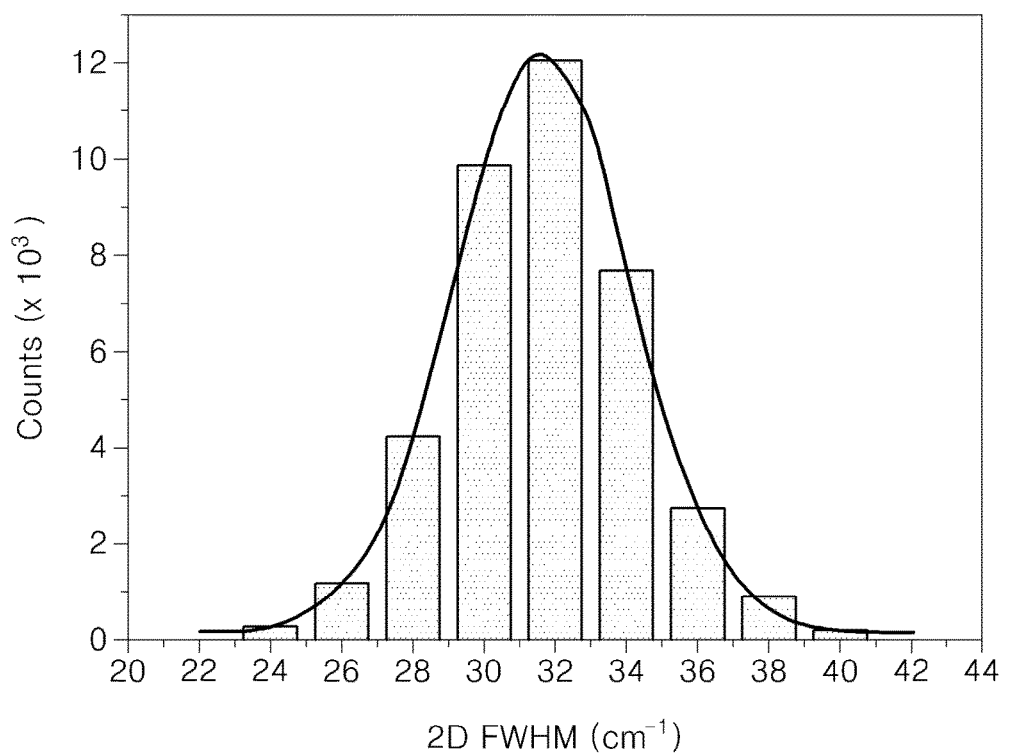
FIG. 12 is a graph of full width at half maximum (FWHM) distribution of 2D band obtained from the Raman spectra of FIG. 9.
Figure 13:
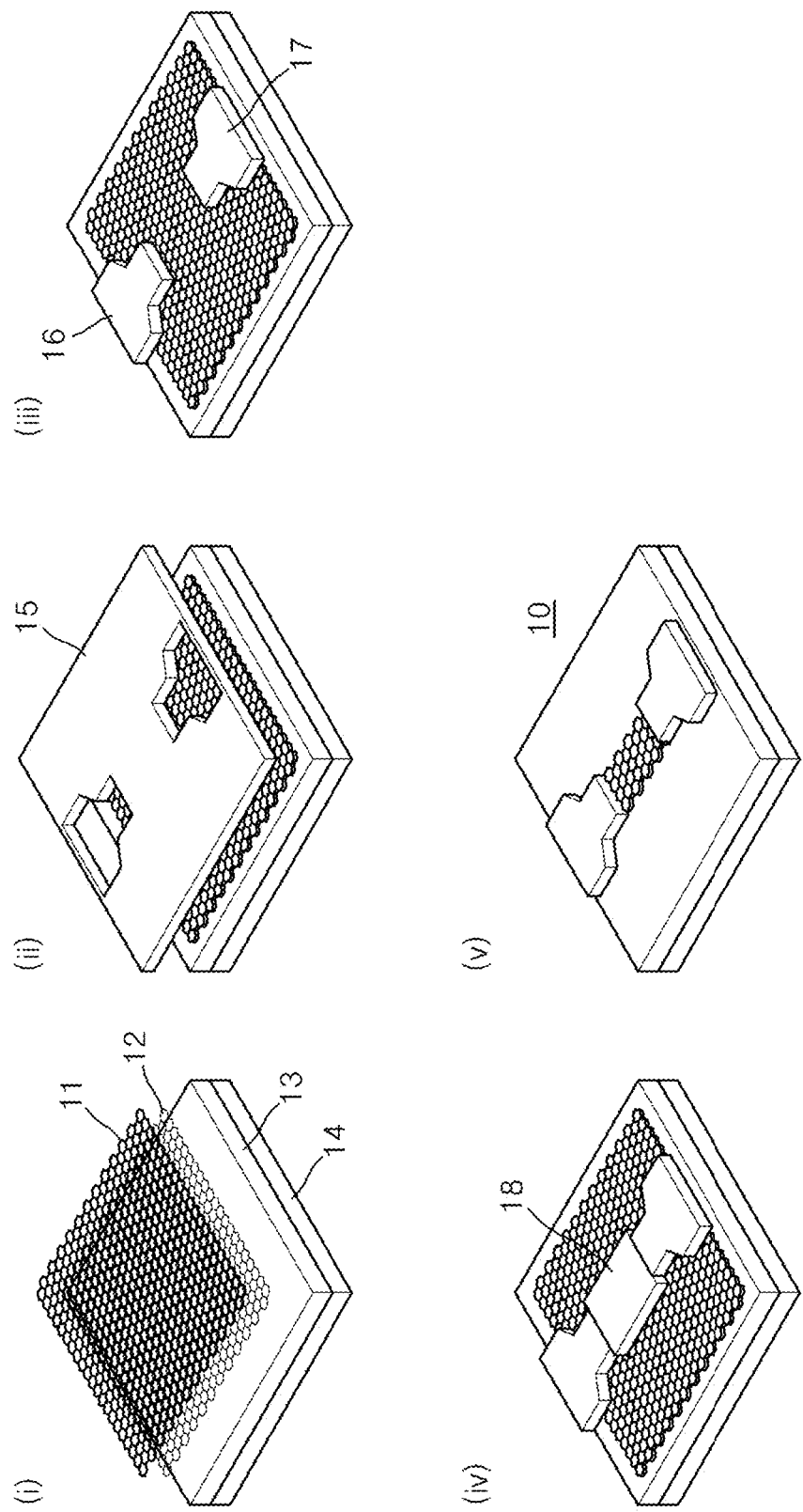
FIG. 13 is a schematic view illustrating a method of manufacturing a graphene-based field effect transistor (FET)

FIG. 12 is a graph illustrating the distribution of FWHM of 2D bands obtained from the Raman spectrum in FIG. 9 of the graphene sheet grown on the h-BN sheet by CVD in Example 1. Referring to FIG. 12, the graphene sheet of Example 1 has an FWHM of 2D band ranging from about 24 cm-1 to about 40 cm-1, mostly about 92% ranging from about 28 cm-1 to about 36 cm-1, which is far smaller than a typical level of double-layered graphene that is about 45 cm-1 to about 60 cm-1.

In summary, the Raman spectrum analysis results of FIGS. 9 to 12 show that a relatively high quality single-layered graphene sheet having a relatively large area is grown by CVD directly on a CVD-grown h-BN sheet.

Example 2

A graphene-based FET was manufactured using the heterogeneous layered structure of graphene sheet/h-BN sheet prepared in Example 1, as illustrated in FIG.

Next, an h-BN sheet 12 with a graphene sheet 11, prepared in Example 1, was transferred using PMMA onto silicon (n-Si)/silica (SiO$_2$) substrates 13 and 14 having a thickness of about 525 µm and about 300 nm, respectively, and a size of 2.5 cm×2.5 cm, followed by removing the PMMA using acetone.

After depositing Au/Cr electrodes (having a thickness of 50 nm and 5 nm, respectively) 16 and 17 on the graphene sheet 11 by photolithography 15, the h-BN sheet 12 and the graphene sheet 11 were etched away by photolithography 18 using O$_2$ plasma, thereby manufacturing a FET device 10 with a channel length of about 5 µm and a channel width of about 2 µm.

Comparative Example 1

A FET device was manufactured in the same manner as in Example 2, except that a graphene sheet grown directly on a Cu foil, instead of the graphene sheet 11 with the h-BN sheet 12 thereon, was transferred onto the silicon (n-Si)/silica (SiO$_2$) substrates 13 and 14.

Comparative Example 2

A FET device was manufactured in the same manner as in Example 2, except that after an h-BN sheet 12 grown on a Cu foil by CVD was transferred onto the silicon (n-Si)/silica (SiO$_2$) substrates 13 and 14, a graphene sheet 11 grown on a Cu foil by CVD was then transferred using PMMA onto the h-BN sheet 12.

Experimental Example 5

FET's Electrical Characteristic Analysis

Resistances (R) with respect to gate voltage (Vg) of the FET devices of Example 2 and Comparative Examples 1 and 2 were measured. The results are shown in FIG. 14.

Referring to FIG. 14, the resistance curves of the FET devices of Example 2 and Comparative Examples 1 and 2 appear almost symmetrical around a gate voltage Vg at the Dirac point, i.e., VDirac, with a peak resistance at VDirac of 1 V, 11 V, and 15 V, respectively. A non-zero VDirac means that undesirable dopants or impurities are present in the graphene device. A smaller VDirac, indicates that less impurities are present in the graphene sheet/h-BN sheet grown by CVD.

A VDirac shift of nearly zero and a minimum conductivity plateau with a smaller width at the Dirac point than those of Comparative Examples 1 and 2 were observed in the FET of Example 2 including the CVD-grown graphene sheet/h-BN sheet. These are attributed to the less interfacial impurities in the CVD-grown graphene sheet/h-BN sheet of Example 2 than in the mechanically transferred graphene sheets of Comparative Examples 1 and 2. A VDirac shift greater than 10 V in the FET devices of Comparative Examples 1 and 2 is attributed to the presence of more interfacial impurities.

A carrier mobility with respect to carrier density (n) in each of the FET devices of Example 2 and Comparative Examples 1 and 2 was measured. The carrier density (n) was calculated as n=Cg (Vg−VDirac)/e. The results are shown in FIG. 5. A gate capacitance Cg of each of the FET devices was determined based on geometrical consideration.

Referring to FIG. 15, the FET device of Example 2 is found to have a significantly improved carrier mobility, compared to the FET devices of Comparative Examples 1 and 2, specifically at a low carrier density (n) of about 1011 cm2 to about 1012 cm2. This is also attributed to the less interfacial impurities in the FET device of Example 2.

As described above, according to example embodiments, a heterogeneous layered structure manufactured by disposing sequentially a graphene sheet by a vapor phase method on a large-area h-BN sheet grown directly on a metal substrate by a vapor phase method may have a relatively high interfacial quality with nearly no impurities at the interface between the graphene sheet and the h-BN sheet. The relatively high-quality, large-area heterogeneous layered structure including the h-BN and graphene sheets may be applicable to a variety of electronic devices, including a FET.

It should be understood that example embodiments described therein should be considered in a descriptive sense only and not for purposes of limitation. Descriptions of features or aspects within each embodiment should typically be considered as available for other similar features or aspects in other embodiments.

What is claimed is:

1. A heterogeneous layered structure comprising:
   a hexagonal boron nitride sheet; and
   a graphene sheet on the hexagonal boron nitride sheet,
   wherein an intensity ratio of D-band to G-band ($I_D/I_G$) in a Raman spectrum of the heterogeneous layered structure is about 0.5 or less, and
   wherein the heterogeneous layered structure leads to a Dirac point shift of about 0 V to about 10 V in a plot of resistance (R) versus gate voltage ($V_g$) in an electronic device.

2. The heterogeneous layered structure of claim 1, wherein the hexagonal boron nitride sheet has a single-layer thickness of about 10 nm or less.

3. The heterogeneous layered structure of claim 1, wherein the graphene sheet is a single-layer graphene.

4. The heterogeneous layered structure of claim 1, wherein a full width at half maximum (FWHM) of a 2D peak in a Raman spectrum of the heterogeneous layered structure is from about 20 $cm^{-1}$ to about 40 $cm^{-1}$, and about 90% or more of the FWHMs in the Raman spectrum are from about 28 $cm^{-1}$ to about 36 $cm^{-1}$.

5. The heterogeneous layered structure of claim 1, wherein the Dirac point shift is about 0 V to about 5 V.

6. The heterogeneous layered structure of claim 1, wherein the heterogeneous layered structure has at least one of a width and a length that is about 1 cm or greater, or an area of about 1 $cm^2$ or greater.

7. An electronic device comprising the heterogeneous layered structure of claim 1.

8. A transistor comprising the heterogeneous layered structure of claim 1.

* * * * *